(12) United States Patent
Jakobsen et al.

(10) Patent No.: US 6,756,138 B1
(45) Date of Patent: Jun. 29, 2004

(54) MICRO-ELECTROMECHANICAL DEVICES

(75) Inventors: Henrik Jakobsen, Horten (NO); Svein Moller Nilsen, Horten (NO); Soheil Habibi, Horten (NO); Timothy Lommasson, Horten (NO)

(73) Assignee: Sensonor ASA, Horten (NO)

( * ) Notice: Subject to any disclaimer, the term of this patent is extended or adjusted under 35 U.S.C. 154(b) by 0 days.

(21) Appl. No.: 09/711,834

(22) Filed: Nov. 13, 2000

(51) Int. Cl.⁷ ............................ B32B 15/04; H05K 7/00; H01L 23/48
(52) U.S. Cl. ................ 428/699; 428/457; 428/469; 428/472; 428/697; 428/698; 428/704; 361/728; 361/736; 361/748; 361/751; 257/688; 257/690; 257/763; 257/764; 257/765; 257/781; 257/784
(58) Field of Search ....................... 428/472, 457, 428/472.2, 689, 697, 698, 699; 361/728, 736, 748, 751; 257/688, 690, 763–765, 781, 784

(56) References Cited

U.S. PATENT DOCUMENTS

| | | | |
|---|---|---|---|
| 3,607,379 A | | 9/1971 | Leinkram |
| 5,207,103 A | | 5/1993 | Wise et al. |
| 5,406,446 A | * | 4/1995 | Peters et al. ............. 361/301.2 |
| 5,449,955 A | | 9/1995 | Debiec et al. |
| 5,508,228 A | * | 4/1996 | Nolan et al. ................. 438/614 |
| 5,591,679 A | * | 1/1997 | Jakobsen et al. ............. 438/51 |
| 5,592,736 A | * | 1/1997 | Akram et al. ................ 257/706 |
| 5,739,046 A | * | 4/1998 | Lur et al. .................... 438/643 |
| 5,789,271 A | | 8/1998 | Akram |
| 6,025,277 A | * | 2/2000 | Chen et al. ................. 438/397 |
| 6,078,103 A | * | 6/2000 | Turner ........................ 257/734 |

FOREIGN PATENT DOCUMENTS

| WO | WO 98/05935 | 2/1993 |
|---|---|---|
| WO | WO 00/26963 | 5/2000 |

\* cited by examiner

*Primary Examiner*—Deborah Jones
*Assistant Examiner*—G. Blackwell-Rudasill
(74) *Attorney, Agent, or Firm*—Boyle, Fredrickson, Newholm, Stein & Gratz, S.C.

(57) ABSTRACT

A device having electrical and mechanical components. The device comprises multiple layers in which:

a first layer or set of layers arranged is to function as one or more electrodes or conductors; and a second layer is arranged to function as one or more press contracts or wire contacts or wire bond pads. The second layer has different physical properties than the first layer, wherein the first layer or set of layers is relatively hard or tough and the second layer is relatively soft or malleable. A corresponding method is provided.

20 Claims, 1 Drawing Sheet

MICRO-ELECTROMECHANICAL DEVICES

This invention relates to micro-electromechanical devices and, in particular, to devices, which are fabricated from several substrates and subjected to anodic bonding during their manufacture.

A number of micro-electromechanical devices, such as accelerometers, pressure sensors, angular rate sensors, inclineometers, etc, are known.

It is well known with such micro-electromechanical devices to provide a glass substrate cover over a semiconductor substrate. Such a cover provides mechanical protection to the device, and can provide a vacuum cavity. The glass can also provide a mount for some of the required electrical components. Placing electrical components on the glass substrate rather than the semiconductor substrate reduces the stray capacitance in the micro-electromechanical device. The glass is bonded to the semiconductor substrate by a process known as anodic bonding and this procedure is known to be harsh and potentially damaging to the components involved.

For example, due to the high temperatures involved, some of the materials may deform so causing defects, which adversely affect the performance of the micro-electromechanical device. Further, stress related effects may disrupt proper functioning of the device after the bonding process.

According to a first aspect of the present invention, there is provided a device comprising electrical and mechanical components comprising multiple layers in which:

a first layer or first set of layers is arranged to function as one or more electrodes or conductors; and a second layer is arranged to function as one or more press contacts or wire bond pads, wherein the second layer has different physical properties than the first layer or first set of layers, wherein the first layer or set of layers is relatively hard or tough and the second layer is relatively soft or malleable.

Preferably, the first layer or first set of layers is formed from a titanium or, more preferably, from titanium and titanium nitride.

Preferably, the second layer is formed from one of aluminium or gold. The first and second layers may be formed on alkali containing borosilicate glass.

Preferably, the first layer is approximately 7000 Å thick and the second layer is approximately 5000 Å thick. The formation, and use of the press contacts as conductors, requires that the thickness of the layers is accurate and reproducible.

The present invention provides electrical and mechanical components which meets the diverse requirements of several functions within the micro-electromechanical device and which can withstand the harsh and potentially damaging environment during anodic bonding. In an embodiment of the invention the components mounted on the glass substrate include capacitor electrodes, conductors, press contacts, and wire bond pads. The conductors are both for electrical connection of the capacitor electrodes and the electric shields. The press contacts form electrical connection to conductors on the mating silicon substrate when the glass and silicon substrates are bonded together by the anodic bonding process.

According to a second aspect of the present invention, there is provided a method of forming electrical and mechanical components in a micro-electromechanical device, the method comprising the steps of:

forming a first layer or set of layers which functions as one or more electrodes or conductors; and forming a second layer which functions as one or more press contacts or wire bond pads, wherein the second layer has different physical properties than the first layer or first set of layers, wherein the first layer or set of layers is relatively hard or tough and the second layer is relatively soft or malleable.

Preferably the first and second layers are etched to form the electrodes/conductors or bond pads/press contacts respectively. This process may include photolithography.

Preferably, the hard layer or set of layers is the first layer or set of layers to be deposited on the glass substrate and, subsequently, the second layer is deposited on top of the first layer. The layers may then be subjected to two or more photolithography steps which firstly pattern the wire bond pads and press contacts in to the second layer and, secondly, pattern the conductors and electrodes, as well as, the wire bond pads and press contacts, in to the first layer or set of layers. The pattern for the first layer must include all the features of the second layer because the first layer is under the second layer.

The first layer may be titanium.

The titanium may act as a getter to reduce the gas pressure in a sealed cavity after anodic bonding, and this preferably occurs at approximately room temperature.

Preferably, the titanium layer forms electrodes which remain flat during anodic bonding and which do not form permanent bonds to a flexible silicon structure during anodic bonding. This also applies to the titanium when used as one or more electrical conductors.

An embodiment of the present invention will now be described with reference to the accompanying drawings in which.

Figure 1:
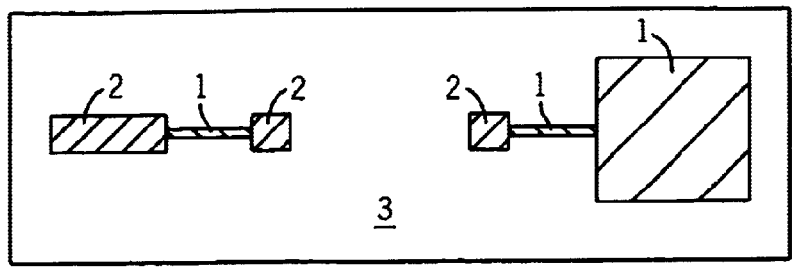
FIG. 1 is a plan view schematic of a glass substrate with one set of components.

In FIG. 1 four components are depicted; 1 two conductors and an electrode, 2 a wire bond pad and press contacts, all are formed on a glass substrate 3.

Figure 2:
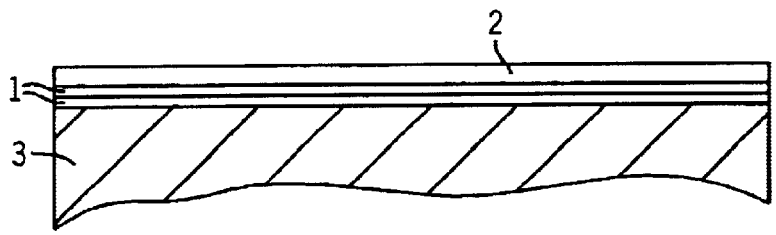
FIG. 2 is a cross-sectional view schematic of the multiple layers after deposition and before patterning.

FIG. 2 shows a first set of layers 1 to be patterned as a capacitor electrode, conductors and as an underlying layer; a wire bond pad and press contacts. A second layer 2 to be patterned as a wire bond pad and press contacts, and the glass substrate 3.

Figure 3:
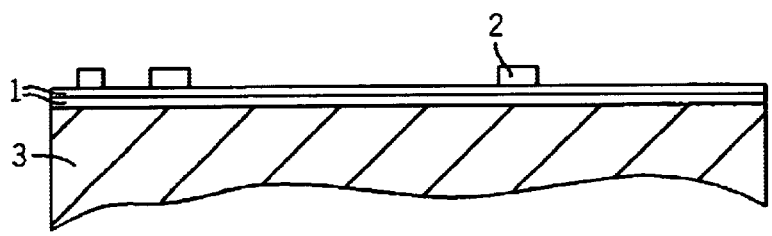
FIGS. 3 and 4 are cross-sectional view schematics through the substrate and layers after the second layer is patterned and after the first set of layers is patterned.

FIG. 3 shows a first set of layers 1 to be patterned as a capacitor electrode, conductors and as an underlying layer; also a wire bond pad and press contacts, and a second layer 2 that has been patterned as a wire bond pad and press contacts, and the glass substrate 3.

Figure 4:
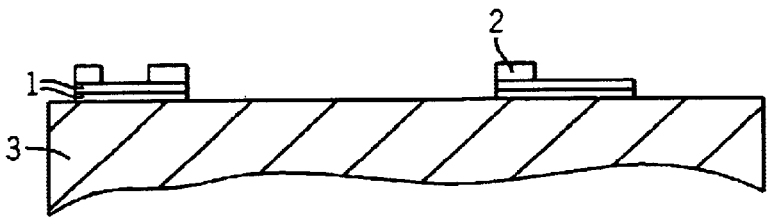

FIG. 4 shows the first set of layers 1 that has been patterned as a capacitor electrode, conductors and as an underlying layer; also a wire bond pad and press contacts, and the second layer 2 that is patterned as a wire bond pad and press contacts, and the glass substrate 3.

Figure 5:
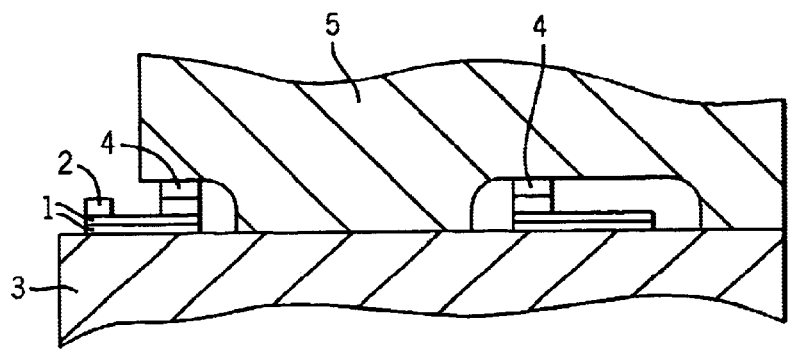
FIG. 5 is a cross section schematic view of a complete device according to the present invention.

FIG. 5 shows a completed device with a first set of layers 1 that is patterned as a capacitor electrode, a conductors and as an underlying layer; also a wire bond pad and press contacts, a second layer 2 that is patterned as a wire bond pad and press contacts, the glass substrate 3, and press contacts 4 mounted on silicon substrate 5. FIG. 5 does not show, however the electrical or mechanical components mounted on the silicon substrate, other than the press contacts.

The method of the invention will now be described.

The first 1 and second 2 layers are deposited on the glass substrate 3 in turn by any one of a number of known processes.

The first and second layers are then subjected to photolithography steps which pattern wire bond pads and press contacts firstly in the second layer and then in the first layer together with any conductor and electrodes that are required. It will be appreciated that the patterns of the first layer must include all of the features of the second layer as it is disposed underneath it.

The photolithography and etching processes, which are proposed to be used with the present invention, are such that the first layer may be wet etched in an; aqueous solution of ammonium hydroxide and hydrogen peroxide. Preferably the solution is made up of one part ammonium hydroxide, five parts hydrogen peroxide and nine parts water. The major concern with the etching process is that the etching should be consistent, that any residue is fully removed and that the line definition and line width is controlled.

The first and second layers may be placed on the glass substrate instead of the semiconductor substrate and this ensures that there is low stray capacitance within the device.

The choice of the materials to use for the first and second layers is dependent upon a number of specific characteristics, which the material must exhibit. The first layer or set of layers needs to have the following attributes: conductive, good adhesion to glass, patternable, low stress, good adhesion to glass after anodic bonding, hard, non-stick to flexible silicon structures and low cost. Other materials fulfill these characteristics except they are difficult or impossible to pattern with a wet etchant. Sputter etching cannot be used because it will damage the glass surface before the anodic bonding.

The second layer must be relatively soft or malleable enough to deform under the pressure applied during anodic bonding so that it can form a reliable press contact, which has low-electrical resistance. Further it must function reliably for use as wire bond pad and be patterned using standard photolithography and a wet etchant. Finally, it should also be a low cost material.

The etching of all layers is preferably selective. That is, each layer must be patterned by etching, without effecting the other layer or layers. Further the etching preferably results in excellent line definition and line width control.

During the anodic bonding, flexible silicon structures are pressed against the first layer by extremely high electric fields in the presence of high temperature. The resulting force per unit area between the flexible silicon structure and the first layer or set of layers is extremely high. Accordingly, the material from which the first layer or set of layers is formed should not undergo plastic deformation or permanently change shape under these extreme conditions. While this quality is often referred to as hard, a tough material, which combines high strength and flexibility, will also fulfill this requirement. The material of the first layer must also be inert with respect to silicon under the extreme conditions in which they are processed. As Anodic Bonding is often done in high vacuum. All materials used for substrates and component layers must be vacuum compatible.

What is claimed is:

1. A device having electrical and mechanical components, the device comprising multiple layers that include;
   a first layer or set of layers arranged to function as one or more electrodes or conductors, wherein the first layer or set of layers is formed from titanium and titanium nitride; and
   a second layer overlying the first layer and arranged to function as one or more press contacts or wire bond pads, wherein the second layer has different physical properties than the first layer, and wherein the first layer or set of layers is relatively hard or tough and the second layer is relatively soft or malleable.

2. A device according to claim 1, wherein the second soft or malleable layer is formed from one of aluminum or gold.

3. A device according to claim 1, wherein the first layer or set of layers is approximately 7000 Å thick.

4. A device according to claim 1, wherein the first layer or set of layers is approximately 3000 Å to 10000 Å thick.

5. A device according to claim 1, wherein the second layer is approximately 5000 Å thick.

6. A device according to claim 1, wherein the second layer is approximately 2000 Å to 6000 Å thick.

7. A device having electrical and mechanical components, the device comprising multiple layers that include:
   a first layer or set of layers arranged to function as one or more electrodes or conductors;
   a second layer overlying the first layer and arranged to function as one or more press contacts or wire bond pads, wherein the second layer has different physical properties than the first layer, and wherein the first layer or set of layers is relatively hard or tough and the second layer is relatively soft or malleable; and
   a sealed cavity defined by one or more surfaces, wherein at least one of the surfaces defining the sealed cavity is formed of titanium.

8. A device according to claim 1, further comprising a substrate, wherein the first layer or set of layers is exposed between the substrate and the second layer and overlies and is bonded directly to the substrate.

9. A device according to claim 8, wherein the first layer or set of layers is bonded to the substrate via anodic bonding.

10. A device having electrical and mechanical components, the device comprising multiple layers that include:
    a first layer or set of layers arranged to function as one or more electrodes or conductors;
    a second layer overlying the first layer and arranged to function as one or more press contacts or wire bond pads, wherein the second layer has different physical properties than the first layer, and wherein the first layer or set of layers is relatively hard or tough and the second layer is relatively soft or malleable; and
    a sealed cavity located in the device.

11. A device having electrical and mechanical components, the device comprising multiple layers that include:
    a first layer or set of layers arranged to function as one or more electrodes or conductors; and
    a second layer arranged to function as one or more press contacts or wire bond pads, wherein the second layer has different physical properties than the first layer, wherein the first layer or set of layers is relatively hard or tough and is formed of titanium, and the second layer is relatively soft or malleable,
    wherein a sealed cavity is located in the device, and wherein the first layer or set of layers is exposed to the sealed cavity.

12. A device according to claim 11, wherein there is a first set of layers formed from titanium and titanium nitride.

13. A device according to claim 11, wherein the second soft or malleable layer is formed from one of aluminum or gold.

14. A device according to claim 11, wherein the first layer or set of layers is approximately 7000 Å thick.

15. A device according to claim 11, wherein the first layer or set of layers is approximately 3000 Å to 10000 Å thick.

16. A device according to claim 11, wherein the second layer is approximately 5000 Å thick.

17. A device according to claim 11, wherein the second layer is approximately 2000 Å to 6000 Å thick.

18. A device according to claim 11, wherein additional titanium is formed on one or more of the surfaces that form an inner surface of the sealed cavity in the device.

19. A device having electrical and mechanical components, the device comprising multiple layers that include:

a first layer or set of layers arranged to function as one or more electrodes or conductors;

a second layer overlying the first layer and arranged to function as one or more press contacts or wire bond pads, wherein the second layer has different physical properties than the first layer, and wherein the first layer or set of layers is relatively hard or tough and the second layer is relatively soft or malleable; and titanium formed on one or more inner surfaces that form a sealed cavity in the device, wherein the titanium on the one or more surfaces forming the sealed cavity acts as a getter in the sealed cavity.

20. A device according to claim 18, wherein the additional titanium in the sealed cavity acts as a getter in the sealed cavity.

* * * * *